United States Patent [19]

Chi et al.

[11] Patent Number: 5,436,201

[45] Date of Patent: Jul. 25, 1995

[54] DUAL ETCHANT PROCESS, PARTICULARLY FOR GATE RECESS FABRICATION IN GAAS MMIC CHIPS

[75] Inventors: Tom Y. Chi, San Gabriel; Danny Li, Torrance; Liping Hou, Rancho Palos Verdes; Tom Quach, Torrance, all of Calif.

[73] Assignee: Hughes Aircraft Company, Los Angeles, Calif.

[21] Appl. No.: 68,871

[22] Filed: May 28, 1993

[51] Int. Cl.⁶ ............................... H01L 21/8252
[52] U.S. Cl. ........................... 437/203; 437/912; 437/228
[58] Field of Search ............. 156/651, 662; 437/912, 437/228, 40, 225, 203; 148/DIG. 51, DIG. 56, DIG. 65

[56] References Cited

U.S. PATENT DOCUMENTS

| | | | |
|---|---|---|---|
| 4,602,965 | 7/1986 | McNally | 437/912 |
| 4,938,841 | 7/1990 | Shahar et al. | 156/651 |
| 5,112,763 | 5/1992 | Taylor et al. | 437/39 |
| 5,130,764 | 7/1992 | Cetronio et al. | 437/203 |
| 5,139,968 | 8/1992 | Hayase et al. | 437/912 |
| 5,155,053 | 10/1992 | Atkinson | 437/40 |
| 5,160,577 | 11/1992 | Deshpande | 156/651 |
| 5,182,234 | 1/1993 | Meyer | 437/225 |
| 5,196,359 | 3/1993 | Shih et al. | 437/912 |
| 5,240,550 | 8/1993 | Boehnke et al. | 156/651 |
| 5,240,869 | 8/1993 | Nakatami | 437/41 |
| 5,268,315 | 12/1993 | Prasaud et al. | 437/31 |
| 5,270,228 | 12/1993 | Ishikawa | 437/203 |
| 5,316,618 | 5/1994 | Van Lintel | 156/644 |
| 5,334,542 | 8/1994 | Saito et al. | 437/40 |

FOREIGN PATENT DOCUMENTS

| | | | |
|---|---|---|---|
| 2105541 | 4/1990 | Japan | 437/912 |
| 3-278546 | 12/1991 | Japan | 437/912 |
| 6-21102A | 1/1994 | Japan | 437/912 |

OTHER PUBLICATIONS

DiLorenzo, ed., GaAs FET Principles and Technology, Artech House, Inc., 1982, pp. 286–289.
Williams, Gallium Arsenide Processing Techniques, Artech House, Inc, 1984, pp. 69–122.

*Primary Examiner*—Olik Chaudhuri
*Assistant Examiner*—S. Mulpuri
*Attorney, Agent, or Firm*—G. S. Grunebach; T. Gudmestad; W. K. Denson-Low

[57] ABSTRACT

A semiconductor substrate is etched in a two-step sequence, with two different liquid etchants that have different lateral etch rates. The relative time periods for which the etchants are applied are selected to achieve a close match between the actual etch profile and the desired profile. The process is particularly applicable to the formation of a gate recess in a GaAs MESFET for high power amplification.

10 Claims, 4 Drawing Sheets

FIG. 1
(PRIOR ART)
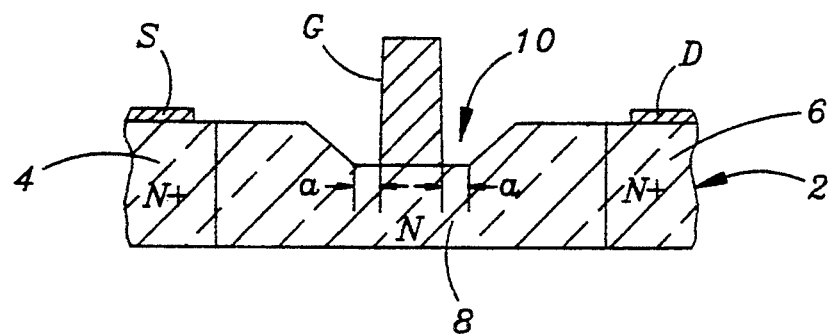
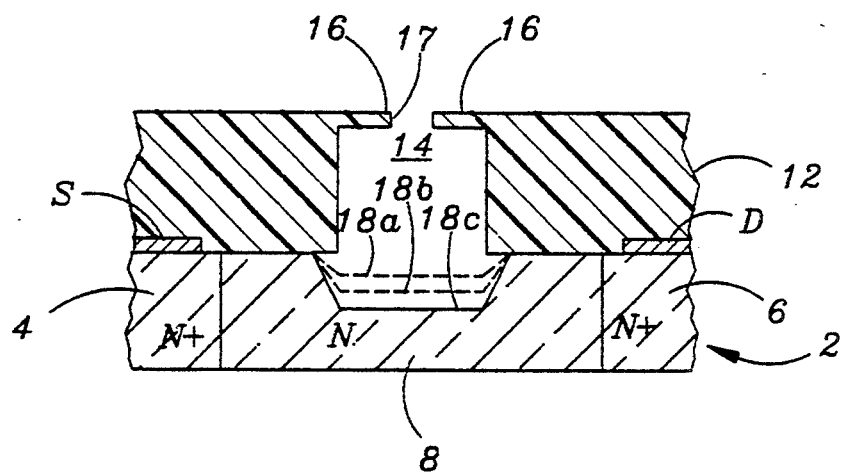
FIG. 2
(PRIOR ART)
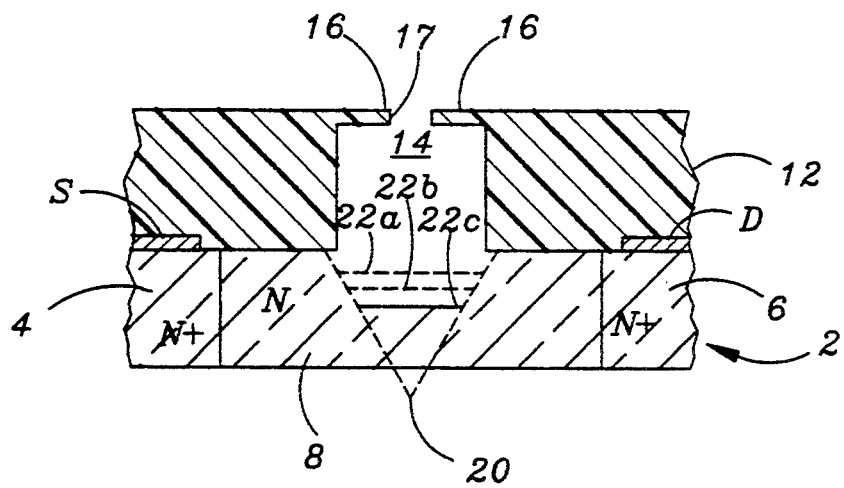
FIG. 3
(PRIOR ART)

DUAL ETCHANT PROCESS, PARTICULARLY FOR GATE RECESS FABRICATION IN GAAS MMIC CHIPS

BACKGROUND OF THE INVENTION

1. Field of the Invention

This invention relates to methods for etching semiconductor substrates, and more particularly to gate recess etching methods used in the fabrication GaAs microwave monolithic integrated circuit (MMIC) chips.

2. Description of the Related Art

GaAs circuits are used primarily for radar and communications applications, both in power amplifiers for transmission and in receive circuitry. It has been established that a higher degree of amplification can be achieved with metal-semiconductor field effect transistors (MESFETs) if the transistor gate is recessed into the GaAs chip, rather than formed on its surface. This type of structure is illustrated in FIG. 1, in which a portion of a GaAs substrate is shown with N+ doped source and drain regions 4 and 6, respective source and drain contacts S and D, and a N-type channel region 8 between the source and drain regions. A recess 10 is formed from the upper substrate surface into the channel region, between and separated from the source and drain regions 4, 6. A metallized gate contact G is established to the floor of the recess.

The dimensions of the recess and gate contact are important factors in determining the characteristics of a power amplifier that employs such a MESFET. Specifically, the dimension "a" between the edges of the gate contact G (in the direction of channel current flow) and the adjacent edges of the recess floor influences the amplifier's operation. In general, a large dimension "a" results in a higher efficiency but lower output power, and a higher breakdown voltage level. Depending upon the ultimate application for the transistor, the dimension "a" is selected to yield an optimum tradeoff among these three performance factors.

While a high degree of accuracy has been achieved in the past in controlling the length of the gate contact G through photolithographic techniques, controlling the width of the gate recess, and thus the dimension "a", has been more difficult. This is because the gate recess is formed by etching through an opening in a photoresist mask, and the profile of the ultimate recess is dependent upon the dimensions of the photoresist opening. However, it is difficult to accurately control the size and shape of this opening. This is because the photoresist process is subject to numerous variables, such as variations in the photoresist thickness, its baking temperature, the intensity of the ultraviolet light used to expose the photoresist, and the concentration of the developer. The difficulty in controlling the "a" dimension makes it difficult to control the performance factors of a power amplifier. Furthermore, different etchants generally have different lateral etch rates relative to their vertical etch rates. It would only be by coincidence that the recess profile associated with a particular etchant would match the optimum profile for a particular application.

A prior effort to optimize the gate recess profile involves a two-step process, in which a shallow, narrow recess is etched with a first mask, followed by replacing the first mask with a second mask through which a narrow recess is etched using the same etchant. This technique is described in DiLorenzo, ed., *GaAs FET Principles and Technology*, Artech House, Inc., 1982, pages 286–289 and Williams, *Gallium Arsenide Processing Techniques*, Artech House, Inc., 1984, page 69. While it provides some improvement in the control of the recess dimensions, it is still subject to the variables described above and results in less than optimum yields.

Two types of etchants are currently in popular use for GaAs applications. Their associated etch processes are illustrated in FIGS. 2 and 3. In FIG. 2, a partially completed MESFET has been coated with a layer of photoresist 12. An opening 14 is provided in the photoresist over the intended gate recess area, with a photoresist overhang 16 extending over part of the upper portion of the opening 14 to provide a reduced diameter entrance opening 17. The amount of overhang effects the size of the gate recess, and also of the metallized gate contact that is added after the recess has been established.

FIG. 2 illustrates the type of etching achieved with an etchant such as phosphoric acid ($H_3PO_4$). The liquid etchant is introduced into the opening and begins removing the exposed GaAs material. With this type of etchant, the width of the recessed floor is approximately equal to the width of the opening 14, regardless of the recess depth. This is illustrated by etch profiles 18a, 18b and 18c, which represent the shape of the recess at successive stages in the etching process as the recess becomes progressively deeper. It can be seen that, in each case, the recess floor is aligned with the lateral walls of the photoresist opening.

Another etching process in common use, typically employing ammonia hydroxide ($NH_4OH$), produces a gate recess that is narrower than the photoresist opening; this is illustrated in FIG. 3. This type of etchant produces a "V-groove" profile, in which the floor of the recess progressively contracts towards a point 20 as the etching proceeds. Three successive stages in the etch process 22a, 22b and 22c are illustrated in FIG. 3, with the floor of the recess becoming progressively narrower at each successive stage.

These two etching processes are described in *Gallium Arsenide Processing Techniques*, supra, pages 108–122. Unfortunately, both are subject to the variations in recess size, described above, associated with the unpredictability of the photoresist, and then will generally not produce an optimum recess profile for a given application. While the double-mask technique referred to above can be used with either etchant, it involves an extra process step and thus increases costs and gives less than optimum yields for either etchant. Furthermore, with the double-mask technique it is difficult to properly align the gate contact with the channel.

In practice, GaAs etching is conventionally performed with a solution of an etchant, hydrogen peroxide ($H_2O_2$) and water. The hydrogen peroxide oxidizes the exposed GaAs surface, with the etchant removing this oxide. Rather than etching for a specified period of time, an initial etch is performed for a time period somewhat less than the expected full etch period. The wafer is then removed from the etching solution and the drain-source current is measured for a given drain-source voltage. Further etching is then performed, after which the wafer is again removed to measure the drain-source current. These alternating etching and measuring cycles are repeated until a desired drain-source current level is reached. This process allows for wafer-to-wafer variations in the GaAs that would not be accounted for with a fixed etch period.

Unlike GaAs, silicon is usually etched with a dry (plasma) etch process. Etching is performed with a single plasma etchant, followed by a second etchant that terminates the etching process and performs a cleanup.

SUMMARY OF THE INVENTION

The present invention seeks to provide a new method of etching a semiconductor substrate, particularly for etching a gate recess for a GaAs MESFET, which results in accurate and repeatable etches, high rates of manufacturing yield, an increase in the output power of power amplifiers fabricated with the method, and the ability to rapidly and easily change the etch profile for different applications, all without requiring an additional mask layer in the fabrication process.

These goals are achieved by etching the semiconductor with two different liquid etchants in succession. The two etchants have different etching behaviors in the semiconductor material, and if applied individually would result in different etch profiles. The active etching time for each etchant is selected so that the final etch profile matches a desired profile.

The method is particularly applicable to etching in GaAs, for which suitable etchants include phosphoric acid ($H_3PO_4$), ammonia hydroxide ($NH_4OH$), hydrochloric acid (HCl), sulfuric acid ($H_2SO_4$) and citric acid ($C_6H_8O_7$); the preferred etchant combination is phosphoric acid and ammonia hydroxide. The substrate is rinsed after the application of each etchant, and is preferably formed with a V-groove wafer orientation ($01\bar{1}$). Etching is performed through an opening in an overlying photoresist mask. A photoresist overhang extends over the opening, and is measured prior to the beginning of etching. The particular etch times for each etchant can then be modified, based upon the measured overhang. The recess profile can be changed simply by changing the relative times each of the etchants are applied.

These and other features and advantages of the invention will be apparent to those skilled in the art from the following detailed description, taken together with the accompanying drawings.

BRIEF DESCRIPTION OF THE DRAWINGS

FIG. 1 is a sectional view of a prior GaAs MESFET, described above;

FIGS. 2 and 3 are sectional views illustrating the prior etching of a gate recess in GaAs using phosphoric acid or ammonia hydroxide, respectively;

DETAILED DESCRIPTION OF THE INVENTION

The fabrication of a MESFET in a GaAs wafer, with a gate recess precisely controlled and closely matched with a desired profile in accordance with the invention, is illustrated in FIGS. 4a–4e. While this is currently the leading application for the invention, the invention is not limited to this particular application. Rather, it is applicable to the etching of semiconductor substrates in general, although at present plasma rather than liquid etching is in common use for semiconductors such as silicon.

Figure 4A:
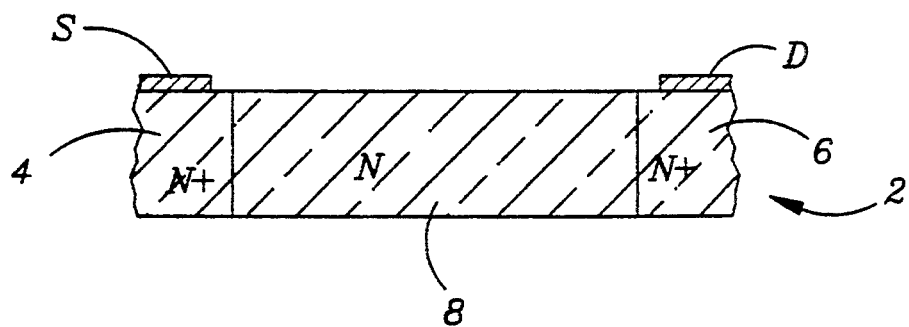
FIGS. 4a–4e are sectional views illustrating successive steps in the fabrication of a GaAs MESFET in accordance with the invention, with the final device illustrated in FIG. 1.
Figure 4B:
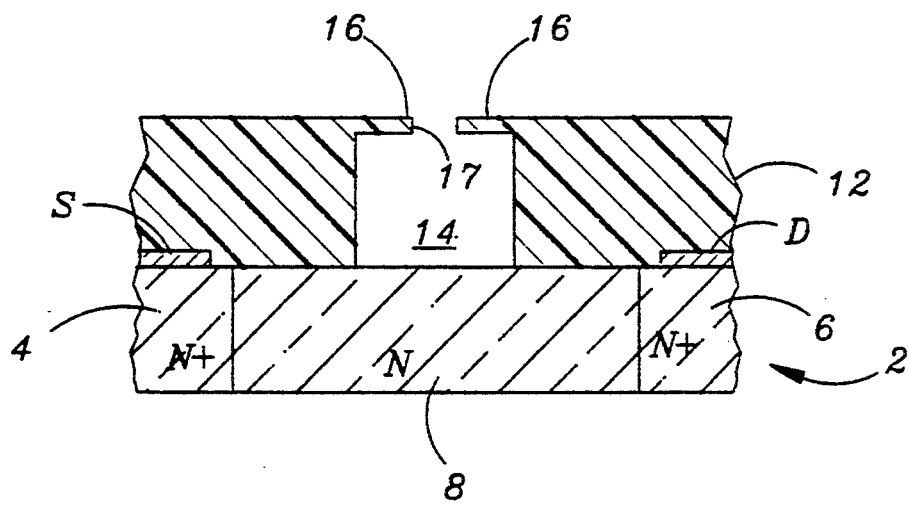
Figure 4C:
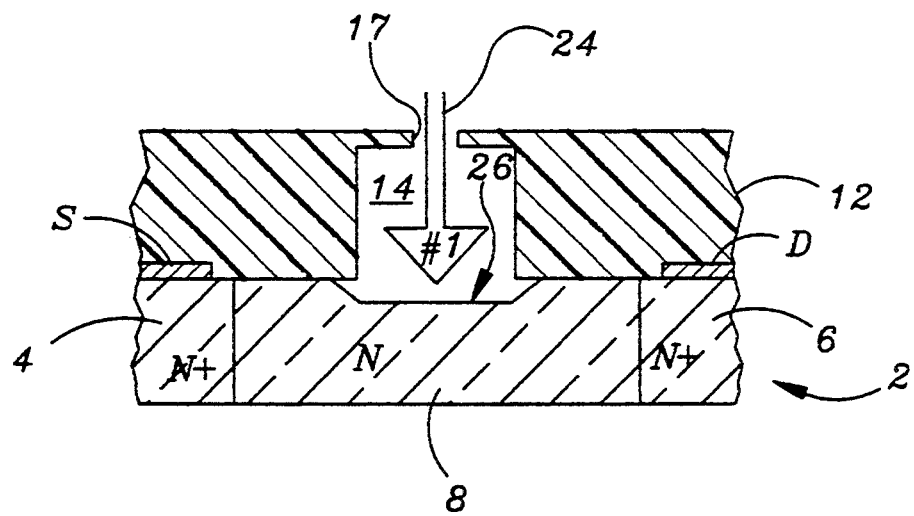

The same reference numbers are employed in FIGS. 4a–4e as in FIGS. 1–3 to refer to common elements. In FIG. 4a a portion of a die on GaAs wafer 2 is shown with implanted N+ source and drain regions 4 and 6, a N-type channel region 8, and source and drain contacts S and D. In FIG. 4b the wafer has been coated with a layer of photoresist 12, with an opening 14 over the intended gate recess area, and a photoresist overhang 16 extending inward partially over the top of opening 14 to provide the reduced entrance opening 17. Up to this point the fabrication process is conventional.

At this point a unique etching process is employed to form the gate recess in a highly accurate and repeatable manner that produces an optimum recess profile. This involves the use of a combination of different etchants which exhibit different etching behaviors in GaAs. With the particular etchants described herein, the lateral etch rates relative to their vertical etch rates differ from etchant to etchant. The etch time with each etchant is controlled to produce the desired recess profile. While in theory more than two etchants could be used, a highly accurate recess can normally be obtained with only two etchants.

The orientation at which the wafer is cleaved from the original GaAs crystal must also be taken into account. With a conventional "V-groove" ($0\bar{1}\bar{1}$) wafer orientation, the etching behavior of phosphoric acid and ammonia hydroxide in GaAs is as illustrated in FIGS. 2 and 3, respectively. If the wafer orientation is changed to "dovetail" ($0\bar{1}\bar{1}$). which is the other common orientation, the phosphoric acid etch remains the same as in the V-groove orientation, but an ammonia hydroxide etch is generally too wide to be useful for electrical applications; the invention is therefore most useful for GaAs substrates having a V-groove crystal orientation.

The most commonly used etchants for GaAs are phosphoric acid and ammonia hydroxide. Alternate etchants that can be used with the invention for GaAs include hydrochloric acid (HCl), sulfuric acid ($H_2SO_4$) and citric acid ($C_6H_8O_7$).

The initial formation of a gate recess is accomplished by introducing a liquid etchant 24 through the entrance opening 17 and into the photoresist opening 14 to attack the exposed substrate surface. This produces an initial recess 26, which has a depth less than the ultimate desired depth for the recess. Furthermore, the recess profile at this point is not congruent with the ultimate desired profile. Etching with the first etchant 24 is continued for a predetermined period of time, as determined by the ultimate desired recess profile.

The initial etching can be accomplished simply by placing the wafer in a beaker of the liquid etchant, or alternately by spraying on the etchant. After the predetermined etch period has elapsed, the application of etchant is discontinued and the wafer is rinsed with water to remove any residual etchant.

Figure 4D:
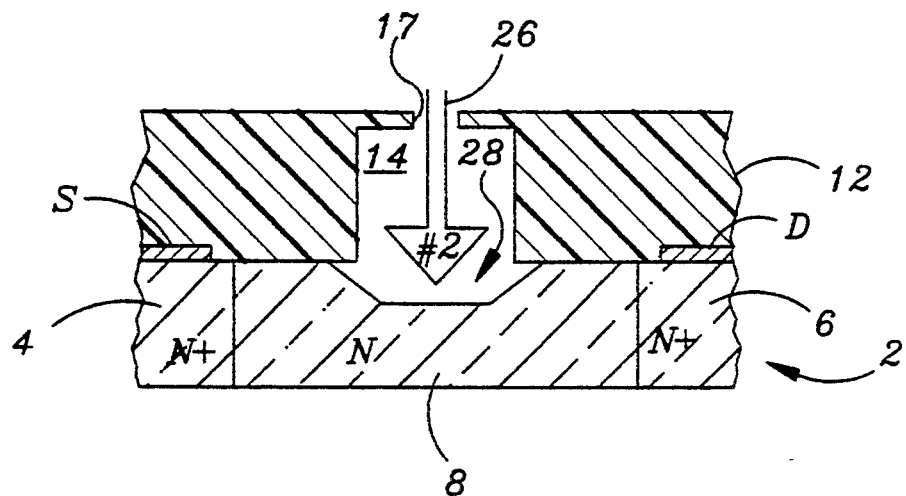

In the next step, illustrated in FIG. 4d, etching of the gate recess is resumed by introducing a second type of liquid etchant 26 into the opening 14. This can be accomplished simply by moving the wafer from one etch beaker to another, or by changing the etch spray. The second etchant 26 is selected so that its etching behavior in GaAs differs from that of the first etchant 24. Etching with the second etchant is continued until a final recess profile 28 that matches the optimum desired profile is reached. The substrate is then rinsed again to remove the second etchant. Either etchant can be applied first; the profile of the ultimate gate recess obtained will generally be independent of the order in which the etchants are used.

The aggregate time that the second etchant is applied can either be set in advance, if there is sufficient confidence in the consistency of the GaAs characteristics from one wafer to the next, or it can be determined by a conventional alternation between etching and drain-source current measurement. Once the etch time for the second etch has been established for a given wafer, that time period can be used as a base for other wafers. The second etch would be conducted in the other wafers for slightly less than the base etch time to give the basic desired gate recess profile. The etching would then be completed to obtain the final desired profile by a conventional alternation between brief additional etches with the second etchant, and drain-source current measurments.

The gate recess profile can be tailored to the needs of a particular application by the amount of etching performed with each of the two etchants. For example, if the recess is to be relatively wide for a given depth, a relatively long phosphoric acid etch and a relatively short ammonia hydroxide etch would be used. If on the other hand, the desired recess profile has a relatively narrow floor for a given depth, the ammonia hydroxide etch time would be increased and the phosphoric acid time reduced.

Figure 4E:
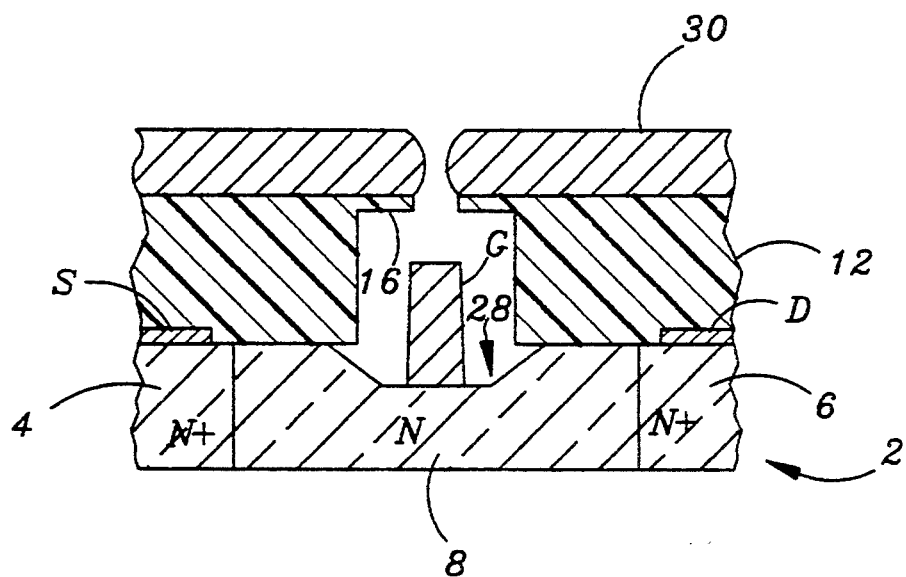

In the next step of the fabrication process, illustrated in FIG. 4e, a metallization 30 is laid down over the wafer and extends in through the entrance opening 17 to form a gate contact G on the floor of the final recess 28. Finally, the photoresist 12 is lifted off in a conventional manner, carrying with it the overlying metallization layer 30 to leave a finished MESFET as shown in FIG. 1.

The width of the recess that is formed in the substrate will generally vary positively with the size of the entrance opening 17. The relative time periods during which each of the two etchants is applied will therefore depend to a certain extent upon the size of this opening. The etchant times can be determined on a trial-and-error basis for a given entrance opening size. During volume manufacturing, the etch times will normally be kept constant from wafer to wafer. The entrance opening size is measured for each wafer, typically with a scanning electron microscope (SEM); the wafer can be reworked if the opening size does not meet the specifications. Since the entrance opening size will generally be repeated for all dies on a given wafer, only one die per wafer need be measured.

Tests were performed with various combinations of phosphoric acid and ammonia hydroxide etchants on a GaAs substrate, with a photoresist opening 14 of about 0.9 micrometers and an entrance opening 17 of about 0.45 micrometers. The phosphoric acid solution was 10 parts phosphoric acid, 40 parts hydrogen peroxide and 500 parts water, while the amonia hydroxide solution was 20 parts amonia hydroxide, 10 parts hydrogen peroxide and 970 parts water. The final etch time for the second etchant was determined with a drain-source voltage of 3 V and a current density in the range of 350–400 mA/mm. In each case the combined etch times were about 90 seconds, which resulted in recesses about 0.3 micrometers deep. The approximate etch times for the two etchants, together with the width of the final recess floor in each case, are summarized below:

| $H_2PO_4$ | $NH_4OH$ | Width ($\mu$m) |
| --- | --- | --- |
| 90 sec. | 0 sec. | 0.9 |
| 60 sec. | 30 sec. | 0.8 |
| 45 sec. | 45 sec. | 0.7 |
| 30 sec. | 60 sec. | 0.6 |
| 0 sec. | 90 sec. | 0.5 |

Figure 5:
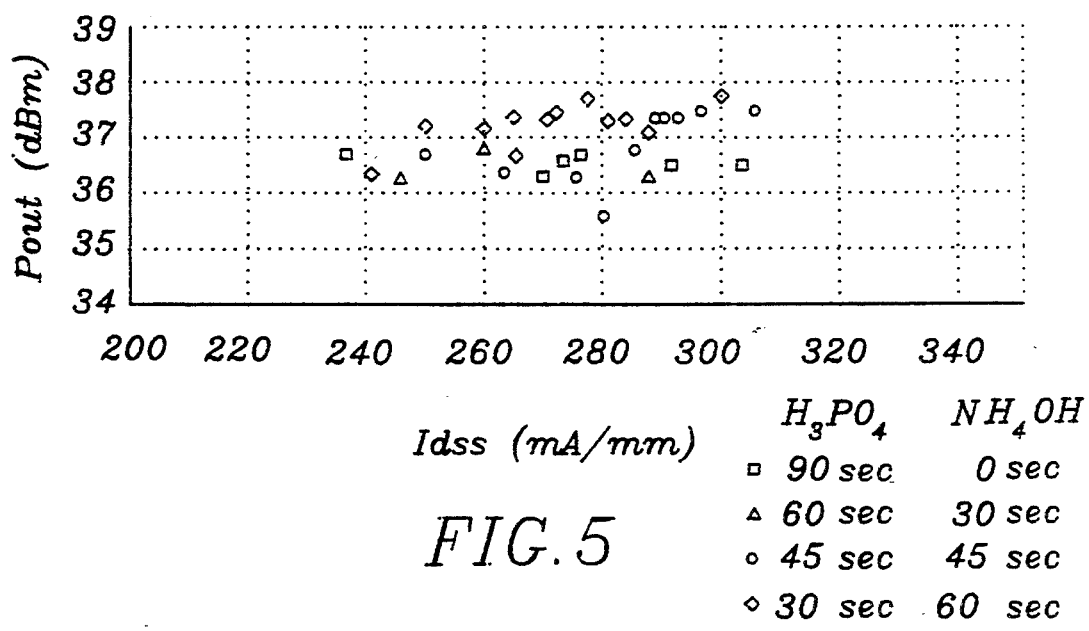
FIG. 5 is a graph illustrating the output power amplification achieved with 4-watt MESFET power amplifiers fabricated by four different combinations of etchant times, as a function of the MESFET drain current density.

FIG. 5 is graph of the power outputs obtained from a nominally 4-watt MESFET-based power amplifier using the first four combinations of etchants described above, as a function of the MESFET drain current density Idss (mA/mm). The output power is given in dBm, in which each increment of three dBm represents a doubling of the output power. These results show an improvement in output power of approximately 30% for the fourth case (30 seconds phosphoric acid, 60 ammonia hydroxide) as compared to a single etch using only phosphoric acid. The output power increased from about 4 watts to about 5.2 watts.

Figure 6:
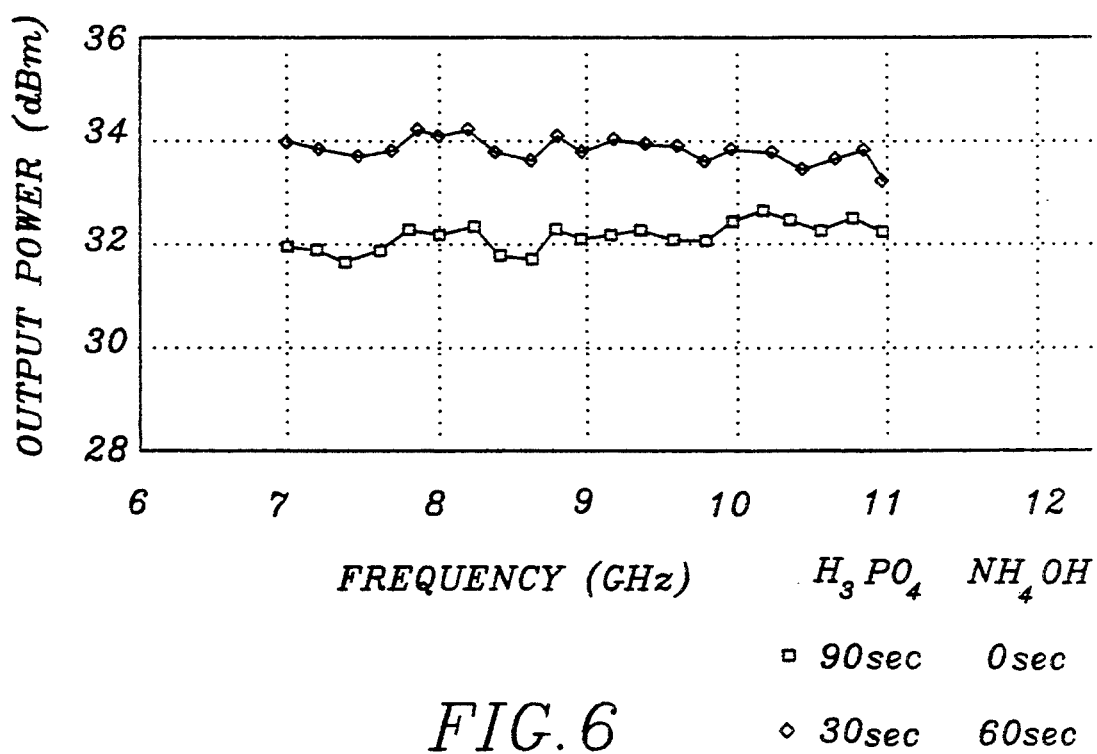
FIG. 6 is a graph comparing the output powers achieved with 2-watt power amplifiers fabricated by a prior method and with the invention, as a function of frequency.

A roughly comparable increase was obtained with a 2-watt power amplifier, as illustrated in FIG. 6. The output power was increased to about 2.3 watts with a 30 second phosphoric acid/60 second ammonia hydroxide etch, as compared to about 1.6 watts with a single phosphoric acid etch.

The invention provides a simple and consistent process for forming a desired gate recess profile, which is particularly useful in obtaining optimal performance of GaAs MMIC chips. It allows the chips to be fabricated in high volume with consistently good results, and with a significantly improved manufacturing yield that results in large cost savings. While particular embodiments of the invention have been shown and described, numerous alternate embodiments will occur to those skilled in the art. Accordingly, it is intended that the invention be limited only in terms of the appended claims.

We claim:

1. A method of selectively etching a gate recess with a profile to optimize the performance of a power amplifier device in a GaAs MESFET substrate, comprising:
   applying a first liquid etchant to said GaAs MESFET substrate through a mask opening for a specific period of time as determined by the profile to etch a preliminary recess having a preliminary profile that is non-congruent with said profile, and
   applying at least a second liquid etchant to said GaAs MESFET substrate through a mask opening for a specific period of time as determined by the profile to extend said preliminary recess to a final recess, said final recess providing said profile said first and second etchants having a different etching behaviors in said substrate.

2. The method of claim 1, further comprising the steps of rinsing said GaAs MESFET substrate after each etch step to remove residual etchant.

3. The method of claim 2, wherein said first and second etchants are selected from the group consisting of $H_3PO_4$, $NH_4OH$, HCL, $H_2SO_4$ and $C_6H_8O_7$.

4. The method of claim 3, wherein one of said first and second etchants is $H_3PO_4$ and the other is $NH_4OH$.

5. A method of forming a GaAs microwave monolithic integrated circuit (MMIC) metal semiconductor field effect transistor (MESFET), comprising:
 a) forming an active layer and a source and drain in a GaAs substrate,
 b) forming a photoresist layer over said substrate with an opening in the photoresist layer generally over a gate recess area between said source and drain, said gate recess area further comprising an area to etch,
 c) forming a gate recess with a profile in the substrate between said source and drain within said area to etch by:
  i) etching said substrate through said photoresist opening for a first period of time as determined by a gate recess profile with a first etchant to form a preliminary gate recess having a preliminary profile that is non-congruent with the gate recess profile,
  ii) terminating etching with said first etchant after said first period of time,
  iii) resuming the etching of said substrate for a second period of time as determined by the gate recess profile through said photoresist opening with a second etchant whose etching behavior in GaAs is different from said first etchant's,
  iv) terminating etching with said second etchant when a final gate recess profile has been reached, and
  v) selecting said etchants and their respective etching periods so that said final gate recess profile substantially matches said gate recess profile,
 d) forming a gate contact to said gate recess through said photoresist opening, and
 e) removing said photoresist and overlying gate contact material from said substrate.

6. The method of claim 5, wherein said first and second etchants are selected from the group consisting of $H_3PO_4$, $NH_4OH$, HCl, $H_2SO_4$ and $C_6H_8O_7$.

7. The method of claim 6, wherein one of said first and second etchants is $H_3PO_4$ and the other is $NH_4OH$.

8. The method of claim 7, said GaAs substrate is oriented on (100) and the recess profiles have a (01$\bar{1}$) wafer orientation.

9. The method of claim 5, wherein said photoresist layer is formed with an overhang over said area to etch, further comprising the steps of measuring said opening prior to beginning said etching, and selecting the first and second etch time for said etchants based upon the measured area to etch.

10. The method of claim 5, further comprising the steps of rinsing the substrate after each etch step.

* * * * *